(12) United States Patent
Yang et al.

(10) Patent No.: US 7,726,846 B2
(45) Date of Patent: Jun. 1, 2010

(54) LED LAMP

(75) Inventors: Ri-Lang Yang, Shenzhen (CN); Guang Yu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/346,885

(22) Filed: Dec. 31, 2008

(65) Prior Publication Data

US 2010/0103669 A1   Apr. 29, 2010

(30) Foreign Application Priority Data

Oct. 24, 2008   (CN)   ...................... 2008 1 0305186. 6

(51) Int. Cl.
*F21V 29/00*   (2006.01)
(52) U.S. Cl. .................. 362/294; 362/244; 362/373
(58) Field of Classification Search .................. 362/218, 362/237, 240, 244, 249.02, 294, 311.02, 362/311.06, 311.14, 373, 800
See application file for complete search history.

(56) References Cited

U.S. PATENT DOCUMENTS

| 6,425,678 | B1 * | 7/2002 | Verdes et al. | ................ 362/240 |
| 2009/0027889 | A1 * | 1/2009 | Kang et al. | ................ 362/373 |
| 2009/0103294 | A1 * | 4/2009 | Zhang et al. | ................ 362/294 |

\* cited by examiner

*Primary Examiner*—Y My Quach Lee
(74) *Attorney, Agent, or Firm*—Frank R. Niranjan

(57) ABSTRACT

An LED lamp includes a fixing rod, a first heat sink mounted to the fixing rod, a second heat sink mounted on the first heat sink, a plurality of LED modules attached on the second heat sink and a lamp cover engaging the first heat sink to enclose the second heat sink and the LED modules. The second heat sink includes a plurality of heat-conducting faces formed on a bottom end thereof and arranged at different levels. The LED modules are respectively attached on the heat-conducting faces of the second heat sink. The lamp cover includes a panel and a plurality of annular steps extending outwardly from the panel in sequence. Each annular step has a concave lens attached thereon. The annular steps are located correspondingly to the LED modules of the second heat sink, respectively.

12 Claims, 4 Drawing Sheets

LED LAMP

BACKGROUND OF THE INVENTION

1. Field of the Invention

The disclosure relates to an LED lamp, and more particularly to an LED lamp having a wide illumination area.

2. Description of Related Art

An LED lamp utilizes light-emitting diodes (LEDs) as a source of illumination, in which current flowing in one direction through a junction region comprising two different semiconductors results in electrons and holes coupling at the junction region and generating a light beam. The LED is resistant to shock and has a nearly infinite lifetime under specific conditions, making it a popular cost-effective and high quality replacement for incandescent and fluorescent lamps.

Known implementations of LED modules in an LED lamp make use of a plurality of individual LEDs to generate light. The large number of LEDs, however, increases price and power consumption of the module. Considerable heat is also generated, which, if not adequately addressed at additional expense, impacts LED lamp reliability.

Further, since the LEDs are generally arranged on a printed circuit board having a planar surface, illumination is distributed at a wide variety of spatial angles with marked differences in intensity and brightness, making it unsuitable for environments requiring even and broad illumination.

What is needed, therefore, is an LED lamp which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
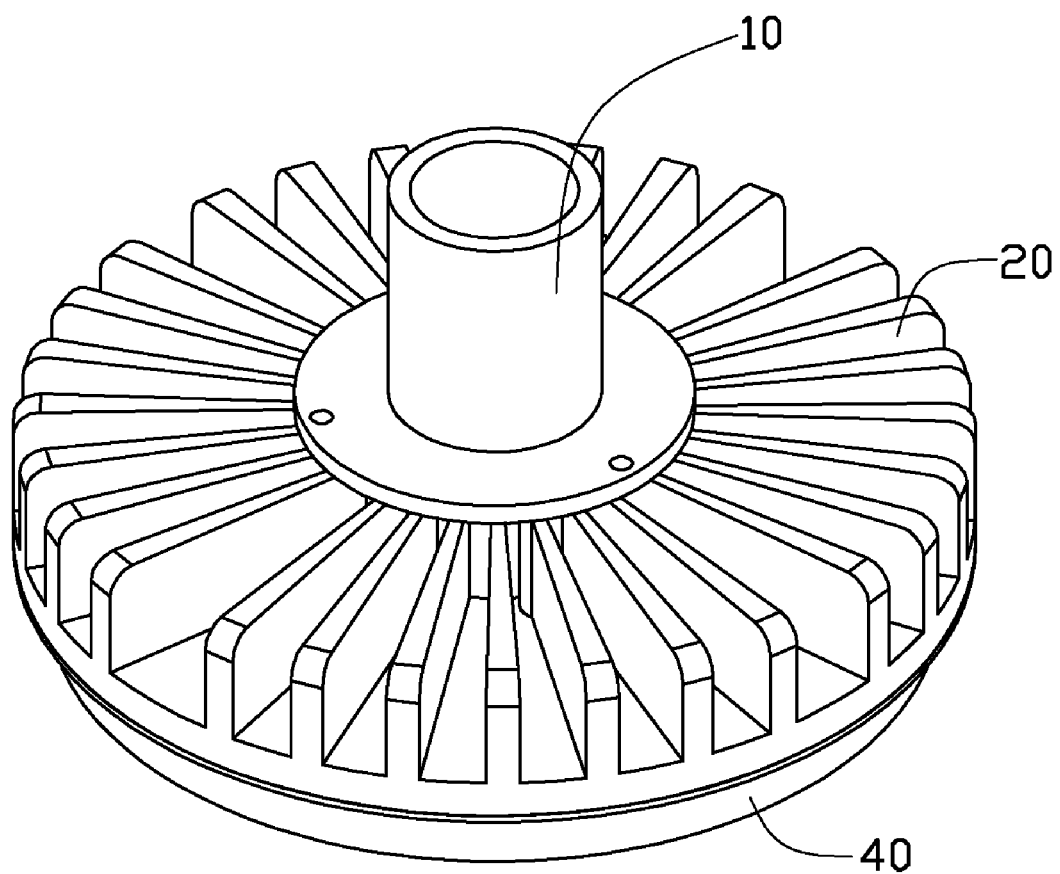
FIG. 1 is an isometric, assembled view of an LED lamp in accordance with a preferred embodiment of the disclosure.
Figure 2:
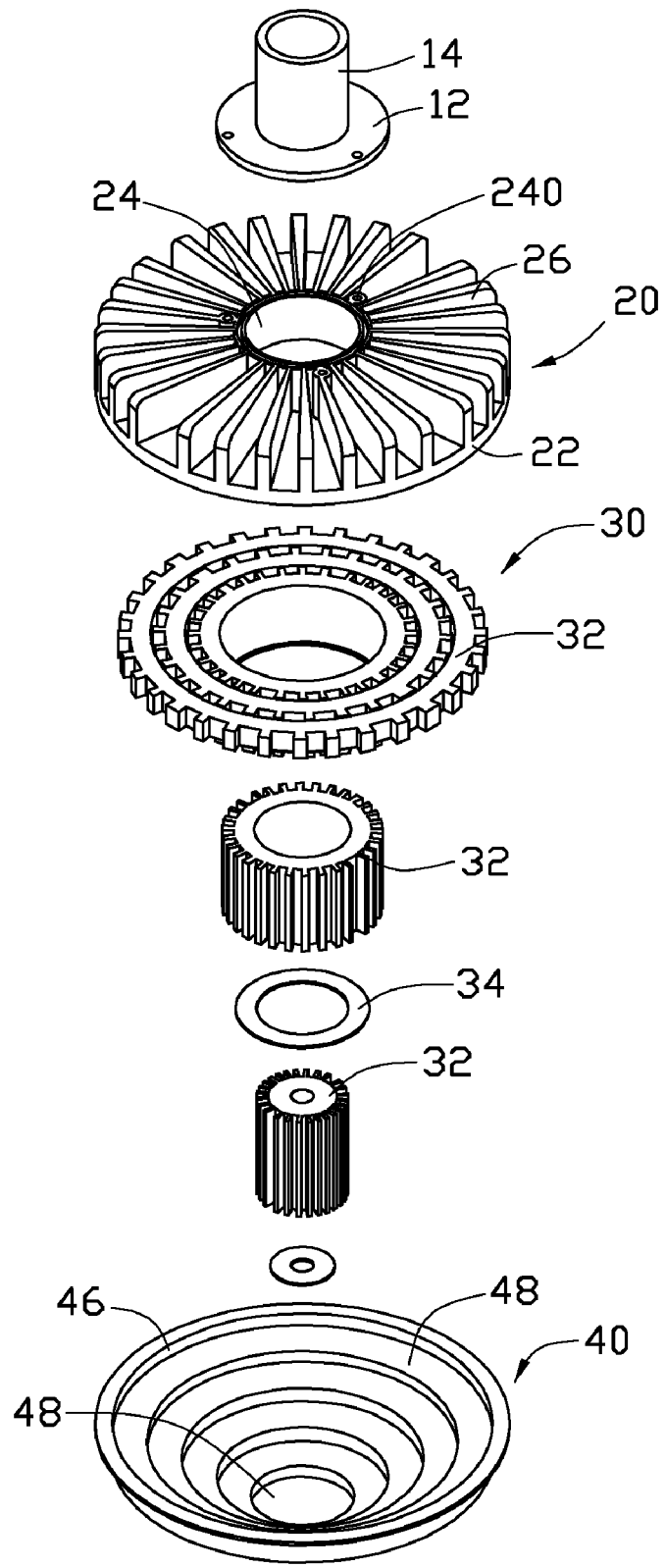
FIG. 2 is an exploded view of FIG. 1.
Figure 3:
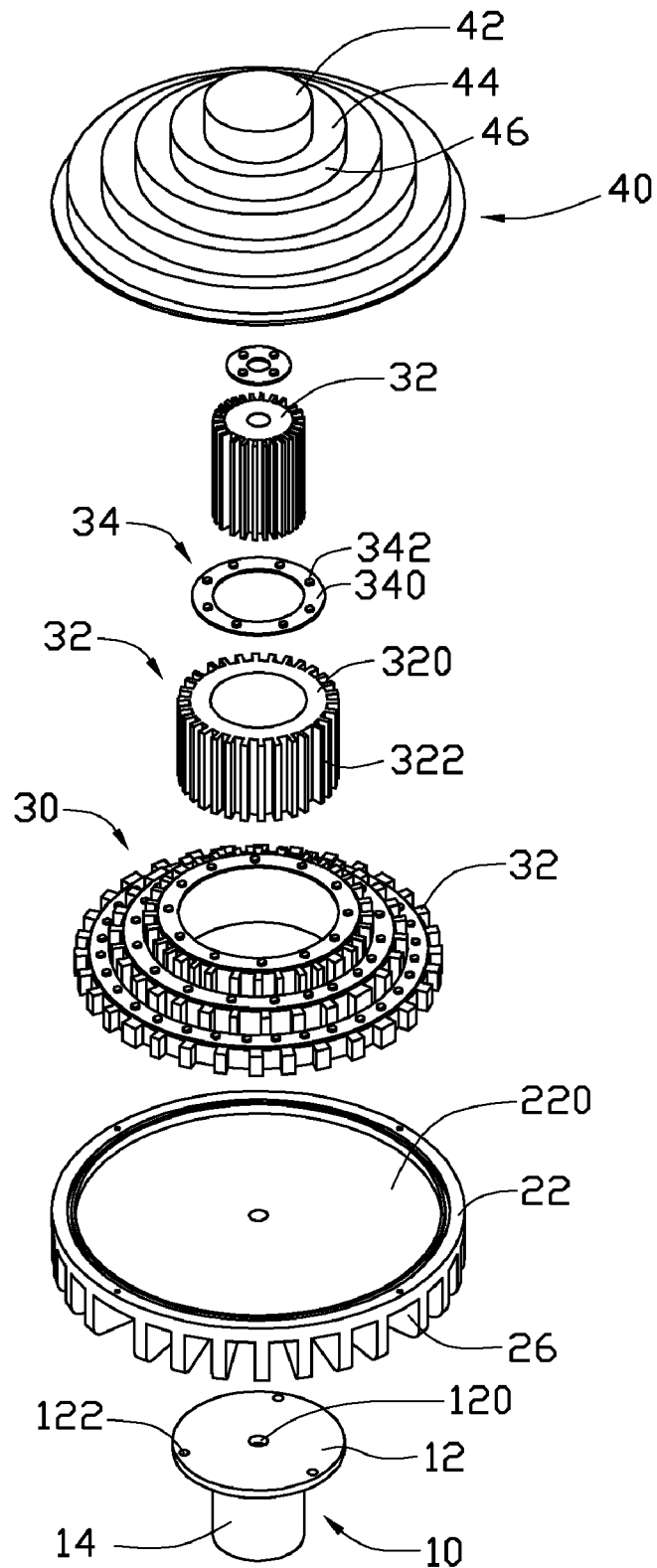
FIG. 3 is an inverted view of FIG. 2.
Figure 4:
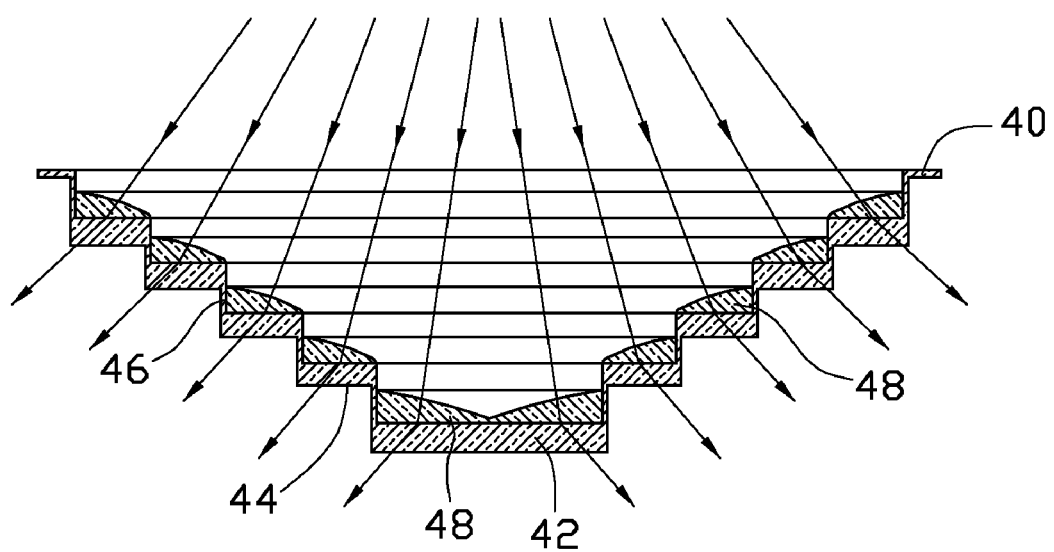
FIG. 4 is a cross-section of a lamp cover of the LED lamp of FIG. 2, with arrows showing paths of light emitted by the LED lamp through the lamp cover.

Referring to FIGS. 1-4, an LED lamp in accordance with a preferred embodiment is illustrated. The LED lamp, which is configured for providing illumination indoors and outdoors, includes a fixing rod 10, a first heat sink 20 fixing to the fixing rod 10, a second heat sink 30 fixed to a bottom of the first heat sink 20, a plurality of LED modules 34 attached to the second heat sink 30 and a lamp cover 40 engaging the first heat sink 20 to enclose the second heat sink 30 and the LED modules 34.

The fixing rod 10 is used for connecting with a mounting post (now shown) to thereby position the LED lamp at a desired position, and comprises a circular mounting plate 12 and a hollow tube 14 extending upwardly and perpendicularly from a top surface of a center of the mounting plate 12. The mounting plate 12 defines a through hole 120 in the center thereof and three mounting holes 122 therein. The three mounting holes 122 are located symmetrically relative to the through hole 120 along a rim of the mounting plate 12, through which fasteners (not shown) extend to engage the first heat sink 20 and thus couple the fixing rod 10 to the first heat sink 20. The hollow tube 14 is formed around the through hole 120, thereby communicating with the first heat sink 20 via the through hole 120, allowing electrical wires (not shown) to pass through the fixing rod 10 to be received in the first heat sink 20.

The first heat sink 20 is integrally formed of a material with good heat conductivity such as aluminum or copper. The heat sink 20 comprises a circular plate base 22 and a cylindrical heat-conducting portion 24 extending upwardly and perpendicularly from a top surface of a center of the plate base 22. A plurality of heat-dissipating fins 26 extend radially and outwardly from a circumference of the heat-conducting portion 24, and simultaneously extend upwardly and perpendicularly from the top surface of the plate base 22. Three fixing holes 240 are defined in a sidewall of the heat-conducting portion 24 along the circumference of the heat-conducting portion 24, in alignment with the mounting holes 122 of the mounting plate 12 of the fixing rod 10, whereby the fasteners (not shown) extend through the mounting holes 122 and engage in the fixing holes 240 to mount the fixing rod 10 on a top of the heat-conducting portion 24 of the first heat sink 20. The heat-conducting portion 24 of the first heat sink 20 is in communication with the hollow tube 14 of the fixing rod 10 via the through hole 120 of the hollow tube 14 when the fixing rod 10 is mounted on the top of the heat-conducting portion 24 of the first heat sink 20, whereby the electrical wires extending through the hollow tube 14 of the fixing rod 10 are received in the heat-conducting portion 24 of the first heat sink 20. A circular receiving recession 220 is defined in a bottom of the plate base 22 of the first heat sink 20, receiving an upper portion of the second heat sink 30 therein.

The second heat sink 30 comprises a plurality of heat-dissipation units 32 overlapping in sequence to form a tower-shaped configuration. The heat-dissipation units 32 gradually increase in height but decrease in diameter from the first heat sink 20 to the lamp cover 40, thereby gradually approaching the bottom of the lamp cover 40. Each heat-dissipation unit 32 comprises a cylinder 320 and a plurality of fins 322 extending outwardly from a circumference of the cylinder 320. The cylinder 320 has a heat-conducting face (not labeled) at one end (i.e., lower end) thereof, on which one corresponding LED module 34 is attached. The cylinders 320 gradually increase in height but decrease in diameter from the first heat sink 20 to the lamp cover 40, i.e. an inner cylinder 320 closely surrounded by an outer cylinder 320 is higher than the outer cylinder 320, but is smaller in diameter than the outer cylinder 320. The LED modules 34 are directly attached on the heat-conducting faces of the cylinders 320, respectively; thus, the LED modules 34 each are of similar size to the heat-conducting face of the respective cylinder 320. Each LED module 34 comprises an annular printed circuit board 340 and a plurality of LED components 342 arranged thereon. The annular printed circuit boards 340 gradually decrease in diameter from the first heat sink 20 to the lamp cover 40, i.e. the annular printed circuit boards 340 decrease from outside to inside, corresponding to the heat-conducting faces of the cylinders 320 on which the annular printed circuit boards 340 are respectively attached. The LED modules 34 attached on the respective cylinders 320 are located at different levels, thereby providing a gradually increasing illumination range from the lamp cover 40 to the first heat sink 20. In another embodiment, it is understood that the second heat sink 30 is integrally formed and has a plurality of heat-conducting faces formed along a circumference thereof and located at different levels. The LED modules 34 are respectively attached to the heat-conducting faces of the second heat sink.

The lamp cover 40 is transparent/translucent plastic or glass and acts as a concave lens, refracting and guiding light emitted by the LED modules 34 in this embodiment. The lamp cover 40 is tower-shaped corresponding to the shape of the second heat sink 30. The lamp cover 40 comprises a circular panel 42, a plurality of annular steps 44 extending outwardly from the circular panel 42 in sequence and a plurality of sidewalls 46 respectively extending perpendicularly from respective adjacent annular steps 44. As better seen in FIGS. 2 and 4, each annular step 44 includes a single concave lens 48 on an inner surface thereof, and the circular panel 42 has a concave lens 48 on an inner surface thereof. The annular steps 44 gradually increase in diameter upwardly and outwardly from the circular panel 42 of the lamp cover 40 to the outer edge of the plate base 22 of the first heat sink 20, corresponding to the LED modules 34 attached on the heat-conducting faces of the cylinders 320 of the heat-dissipation units 32 of the second heat sink 30. Thus, the lamp cover 40 presents an outwardly convex periphery due to the configuration of the annular steps 44, with an upper annular step 44 having the largest diameter. Each annular step 44 is of similar size to the heat-conducting face of the cylinder 320 of the corresponding heat-dissipation unit 32 of the second heat sink 30, allowing light emitted by the LED modules 34 to travel completely through the concave lens 48 on the annular step 44.

In assembly, the upper portion of the second heat sink 30 is received in the receiving recession 220 of the plate base 22 of the first heat sink 20 and top ends of the cylinders 320 of the heat-dissipation units 32 of the second heat sink 30 are mounted on the bottom of the plate base 22 of the first heat sink 20. A top of the lamp cover 40 engages the bottom of the plate base 22 of the first heat sink 20 to enclose the second heat sink 30 and the LED modules 34 in the LED lamp.

In use, light emitted by the LED modules 34 located on different levels passes the concave lens 48 of the circular panel 42 and the annular steps 44 of the lamp cover 40, respectively, and is refracted outwardly to generate a wide illumination area.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp comprising:
   a fixing rod adapted for positioning the LED lamp at a desired position;
   a first heat sink mounted to the fixing rod;
   a second heat sink mounted on the first heat sink, the second heat sink comprising an upper portion near the first heat sink and a bottom end remote from the first heat sink, the second heat sink comprising a plurality of heat-conducting faces on the bottom end thereof distant from the first heat sink and arranged in sequence and at different levels, the heat-conducting faces gradually decreasing in dimension from outside to inside of the second heat sink;
   a plurality of LED modules attached on the heat-conducting faces of the second heat sink, respectively; and
   a lamp cover engaging the first heat sink to enclose the second heat sink and the LED modules, the lamp cover comprising a plurality of annular steps corresponding to the LED modules on the levels of the heat-conducting faces of the second heat sink, respectively, each step comprising a concave lens attached thereon;
   wherein light emitted by the LED modules respectively travels through the concave lenses of the annular steps of the lamp cover to generate a wide illumination area.

2. The LED lamp as claimed in claim 1, wherein the second heat sink comprises a plurality of heat-dissipation units overlapping in sequence and the heat-conducting faces are formed on end portions of the heat-dissipation units, respectively.

3. The LED lamp as claimed in claim 2, wherein each heat-dissipation unit comprises a hollow cylinder and a plurality of fins extending outwardly from a circumference of the hollow cylinder, the heat-conducting faces formed on end portions of the hollow cylinders.

4. The LED lamp as claimed in claim 3, wherein the hollow cylinders of the heat-dissipation units of the second heat sink gradually decrease in outer diameter but increase in height from the first heat sink to the lamp cover.

5. The LED lamp as claimed in claim 4, wherein the lamp cover comprises a panel and the annular steps extend outwardly from the panel and gradually increase in dimension remote from the panel of the lamp cover.

6. The LED lamp as claimed in claim 1, wherein the first heat sink comprises a plate base, a hollow cylindrical heat-conducting portion extending from the plate base and a plurality of heat-dissipating fins extending from one of the heat-conducting portion and the plate base, the fixing rod being mounted to the heat-conducting portion of the first heat sink.

7. The LED lamp as claimed in claim 6, wherein the first heat sink defines a receiving recession in a bottom of the plate base, and the upper portion of the second heat sink is received in the receiving recession and mounted on the bottom of the plate base of the first heat sink.

8. The LED lamp as claimed in claim 7, wherein the fixing rod comprises a mounting plate and a hollow tube mounted on the mounting plate, the hollow tube communicating with the heat-conducting portion of the first heat sink via a through hole defined in the mounting plate, through which electrical wires extend to be received in the heat-conducting portion of the first heat sink.

9. An LED lamp comprising:
   a fixing rod adapted for positioning the LED lamp at a desired position;
   a first heat sink fixed to the fixing rod, the first heat sink defining a receiving recession in a bottom thereof;
   a second heat sink received in the receiving recession and mounted on the bottom of the first heat sink, the second heat sink comprising a plurality of heat-conducting faces formed on an end portion thereof, the heat-conducting faces located on different levels;
   a plurality of LED modules respectively attached on the heat-conducting faces of the second heat sink; and
   a lamp cover engaging the receiving recession of the first heat sink to enclose the second heat sink and the LED modules, the lamp cover comprising a panel and a plurality of annular steps extending outwardly from the panel in sequence corresponding to the LED modules on the levels of the heat-conducting faces of the second heat sink, the annular steps gradually increasing in dimension remote from the panel of the lamp cover and each comprising a concave lens attached thereon;
   wherein light emitted by the LED modules respectively travels through the concave lenses of the annular steps of the lamp cover to generate a wide illumination area.

10. The LED lamp as claimed in claim 9, wherein each LED module comprises an annular printed circuit board and a plurality of LED components arranged on the printed circuit board, the printed circuit board being of similar size to one corresponding heat-conducting face of the second heat sink.

11. An LED lamp comprising:
- a first heat sink having a top and a bottom and a plurality of fins formed on the top thereof;
- a second heat sink mounted on the bottom of the first heat sink, the second heat sink comprising a plurality of heat-conducting faces located on a bottom end thereof and arranged in sequence and at different levels, dimensions of the heat-conducting faces and the different levels of the heat-conducting faces gradually decreasing from outside to inside of the second heat sink;
- a plurality of LED modules attached on the heat-conducting faces of the second heat sink, respectively; and
- a lamp cover engaging the first heat sink to enclose the second heat sink and the LED modules, the lamp cover comprising a plurality of annular steps corresponding to the LED modules, respectively.

12. The LED lamp as claimed in claim 11, wherein each step comprising a concave lens attached thereon, wherein light emitted by the LED modules respectively travels through the concave lenses of the annular steps of the lamp cover to generate a wide illumination area.

* * * * *